(12) United States Patent
Takao (10) Patent No.: US 6,639,417 B2
(45) Date of Patent: Oct. 28, 2003

(54) SEMICONDUCTOR PARAMETRIC TESTING APPARATUS

(75) Inventor: Takayuki Takao, Kawasaki (JP)

(73) Assignee: Agilent Technologies, Inc., Palo Alto, CA (US)

( * ) Notice: Subject to any disclaimer, the term of this patent is extended or adjusted under 35 U.S.C. 154(b) by 11 days.

(21) Appl. No.: 09/891,802

(22) Filed: Jun. 26, 2001

(65) Prior Publication Data

US 2002/0000826 A1 Jan. 3, 2002

(30) Foreign Application Priority Data

Jun. 30, 2000 (JP) .......................... 2000-197845

(51) Int. Cl.$^7$ .............................................. G01R 31/28
(52) U.S. Cl. .................. 324/765; 324/158.1; 714/46
(58) Field of Search ................ 324/765, 158.1; 714/25, 46, 724

(56) References Cited

U.S. PATENT DOCUMENTS

| 4,837,764 A | * | 6/1989 | Russello ................ 714/46 |
| 5,390,131 A | * | 2/1995 | Rohrbaugh et al. ........ 716/4 |
| 5,574,730 A | * | 11/1996 | End et al. ............... 714/724 |
| 5,657,438 A | * | 8/1997 | Wygodny et al. ......... 714/1 |

OTHER PUBLICATIONS

HP E3180B, Semiconductor Process Evaluation Core. Software User's Guide, printed in Japan May 1999, Manufacturing Part No. E3180–90601, pp. 1–1 –1–19.
HP E3180B, Semiconductor Process Evaluation Core. Software Creating Your Framework, printed in Japan May 1999, Manufacturing Part No. E3180–90621, pp. 4–1 –4–66 and 5–16 –5–40.

* cited by examiner

Primary Examiner—Ernest Karlsen (57) ABSTRACT

A semiconductor parametric testing apparatus includes designating a die and module on each wafer at which a test should be paused and pausing a test at the preselected die and module on each wafer.

5 Claims, 9 Drawing Sheets

*(Operation Panel screenshot — Session 1, Execute Test, Inspection Mode)*

- Test Under Execution
- ● Elapsed ○ Remaining  0:01:36
- Lot ID [    ] Process [    ]
- Module 14 of 37    ● Raw Data ○ Statistics

| Die No. | Item | Value | Unit | Judgment |
|---|---|---|---|---|
| 6 | V9N640_PCHMOS_P3_LEAKCHK_1 | -12.592950 | A | Pass |
| 6 | V9N640_PCHMOS_P3_LEAKCHK_1 | -12.674205 | A | Pass |
| 6 | V9N640_PCHMOS_P3_LEAKCHK_1 | -12.854017 | A | Pass |

Wafer Test Result — ☐ Pass ▨ Awaiting ☐ Testing ■ Fail ▧ Alignment ☐ Skip

V9N640 wafer map — ☐ Pass ▨ Awaiting ☐ Testing ■ Fail ☐ Skip

Click Pause to stop the test.

[ Pause ]

*(Operation Panel screenshot — Session 1, Execute Test, Inspection Mode)*

- Test Paused (Before Module Test)
- ● Elapsed ○ Remaining  0:02:01
- Lot ID [    ] Process [    ]
- Module 4 of 37    ● Raw Data ○ Statistics

| Die No. | Item | Value | Unit | Judgment |
|---|---|---|---|---|
| 6 | V9N640_CAPL_H+1_CAP_G | 837.243547n | S | Pass |
| 6 | V9N640_CAPL_H-1_CAP_C | 90.230156p | F | Pass |
| 6 | V9N640_CAPL_H-1_CAP_G | 982.328604n | S | Pass |

Wafer Test Result — ☐ Pass ▨ Awaiting ☐ Testing ■ Fail ▧ Alignment ☐ Skip

V9N640 wafer map — ☐ Pass ▨ Awaiting ☐ Testing ■ Fail ☐ Skip

Click Continue to continue test.

[ Continue ] [ Probe Die/Module ] [ Analyze Datafile ] [ Option ]

| Slot | Lot ID | Wafer ID | Item Yierd | Die Yield | Judge |
|---|---|---|---|---|---|
| 1 | | 1 | 100.00 | 100.00 | Pass |
| 2 | | 2 | 100.00 | 100.00 | Pass |
| 3 | | 3 | 100.00 | 100.00 | Pass |
| 4 | | 4 | 100.00 | 100.00 | Pass |
| 5 | | 5 | 100.00 | 100.00 | Pass |
| 6 | | 6 | 100.00 | 100.00 | Pass |
| 7 | | 7 | 100.00 | 100.00 | Pass |
| 8 | | 8 | 100.00 | 100.00 | Pass |
| 9 | | 9 | 100.00 | 100.00 | Pass |
| 10 | | 10 | 100.00 | 100.00 | Pass |
| 11 | | 11 | 100.00 | 100.00 | Pass |
| 12 | | 12 | 100.00 | 100.00 | Pass |
| 13 | | 13 | 100.00 | 100.00 | Pass |
| 14 | | 14 | 100.00 | 100.00 | Pass |
| 15 | | 15 | 100.00 | 100.00 | Pass |
| 16 | | 16 | 100.00 | 100.00 | Pass |
| 17 | | 17 | 100.00 | 100.00 | Pass |
| 18 | | 18 | 100.00 | 100.00 | Pass |
| 19 | | 19 | 100.00 | 100.00 | Pass |
| 20 | | 20 | 100.00 | 100.00 | Pass |
| 21 | | 21 | 100.00 | 100.00 | Pass |
| 22 | | 22 | 100.00 | 100.00 | Pass |
| 23 | | 23 | 100.00 | 100.00 | Pass |
| 24 | | 24 | 100.00 | 100.00 | Pass |
| 25 | | 25 | 100.00 | 100.00 | Pass |

Select wafers to test again.

Complete Test     Start Retest

SEMICONDUCTOR PARAMETRIC TESTING APPARATUS

BACKGROUND OF THE INVENTION

1. Field of the Invention

The present invention relates to a semiconductor testing apparatus and, more particularly, to a semiconductor parametric testing apparatus for measuring several parameters for semiconductors on a wafer and testing them in, for example, the process for manufacturing semiconductor integrated circuits.

2. Description of the Related Art

One of the purposes of a semiconductor parametric tester is to test wafers in the process for manufacturing semiconductor circuit devices. An example of a semiconductor parametric tester used for this purpose will now be described with reference to FIG. 6. A semiconductor parametric testing system 1 comprises a tester body 3 for providing electric signals to a wafer 2 to be tested and measuring electric signals from the wafer 2, a wafer prober 5 for taking the wafer 2 out of a wafer lot 4 and putting its probe on a predetermined die, a computer 6A for controlling the tester body 3 and wafer prober 5 and processing measured data, and a measuring program group 6B for operating the computer 6A.

Figure 6:
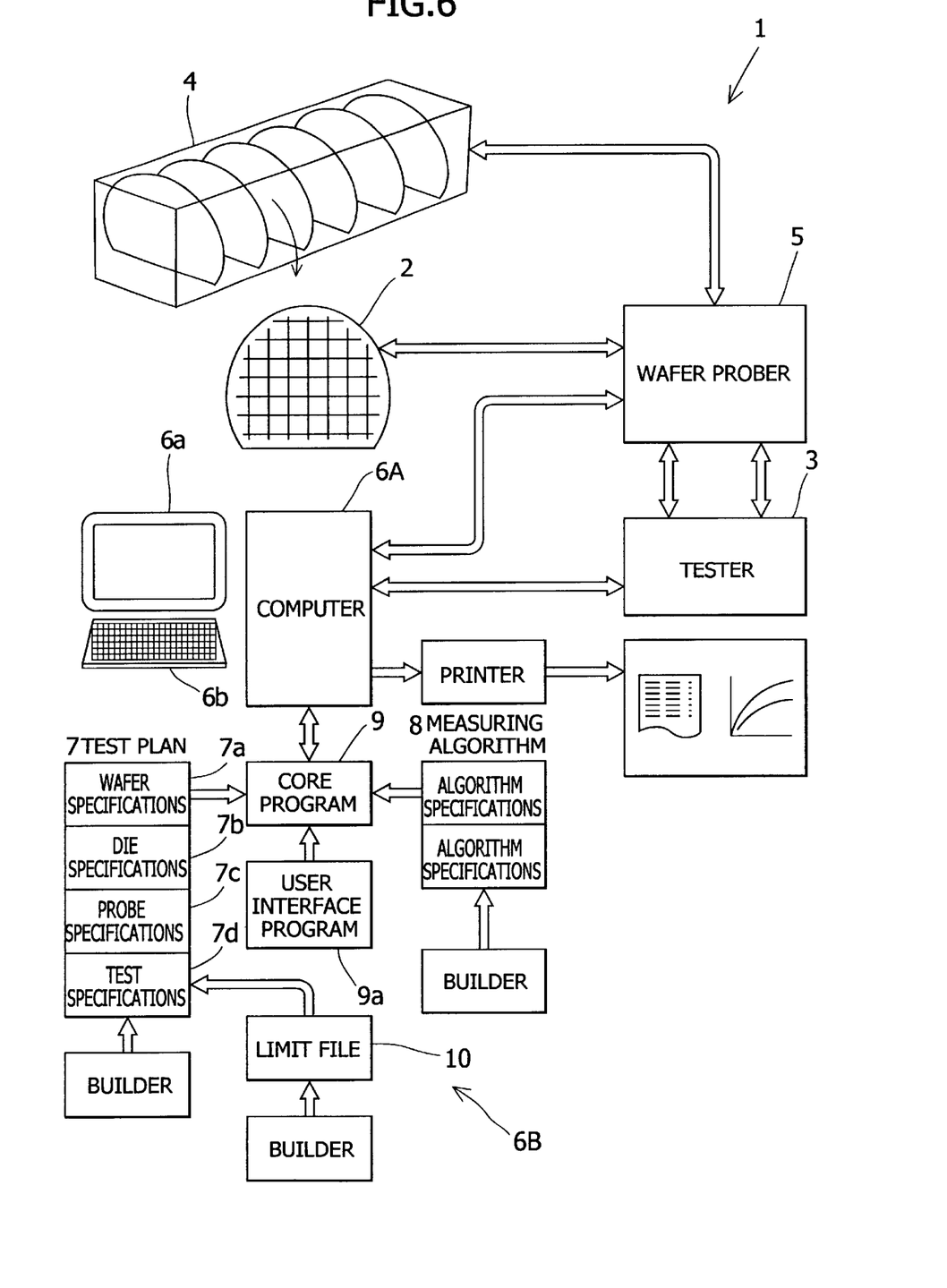
FIG. 6 is a block diagram showing the entire configuration of a conventional semiconductor parametric testing apparatus to which the present invention applies.

The measuring program group 6B comprises: a test plan 7 consisting of information files regarding the wafer 2, devices on it, and the like; a measuring algorithm 8 consisting of files for defining a measuring algorithm; a core program 9 for initializing each section, loading and executing the test plan 7 and measuring algorithm 8; and a limit file 10. Furthermore, the measuring program group 6B includes a user interface program 9a for accepting input information from an operator and outputting information to him/her via a display and keyboard. Each of the test plan 7, measuring algorithm 8, and limit file 10 includes, for example, a fill-in-the-box builder for enabling a user to create a file easily.

The test plan 7 includes wafer specifications 7a for defining the attributes, such as the name and location, of a die on a wafer, die specifications 7b for defining the name and location of a module on a die, probe specifications 7c for defining a method for connecting device pads on a probe card and switching matrix pins, and test specifications 7d for defining a measuring algorithm used for a device test.

Figure 7:
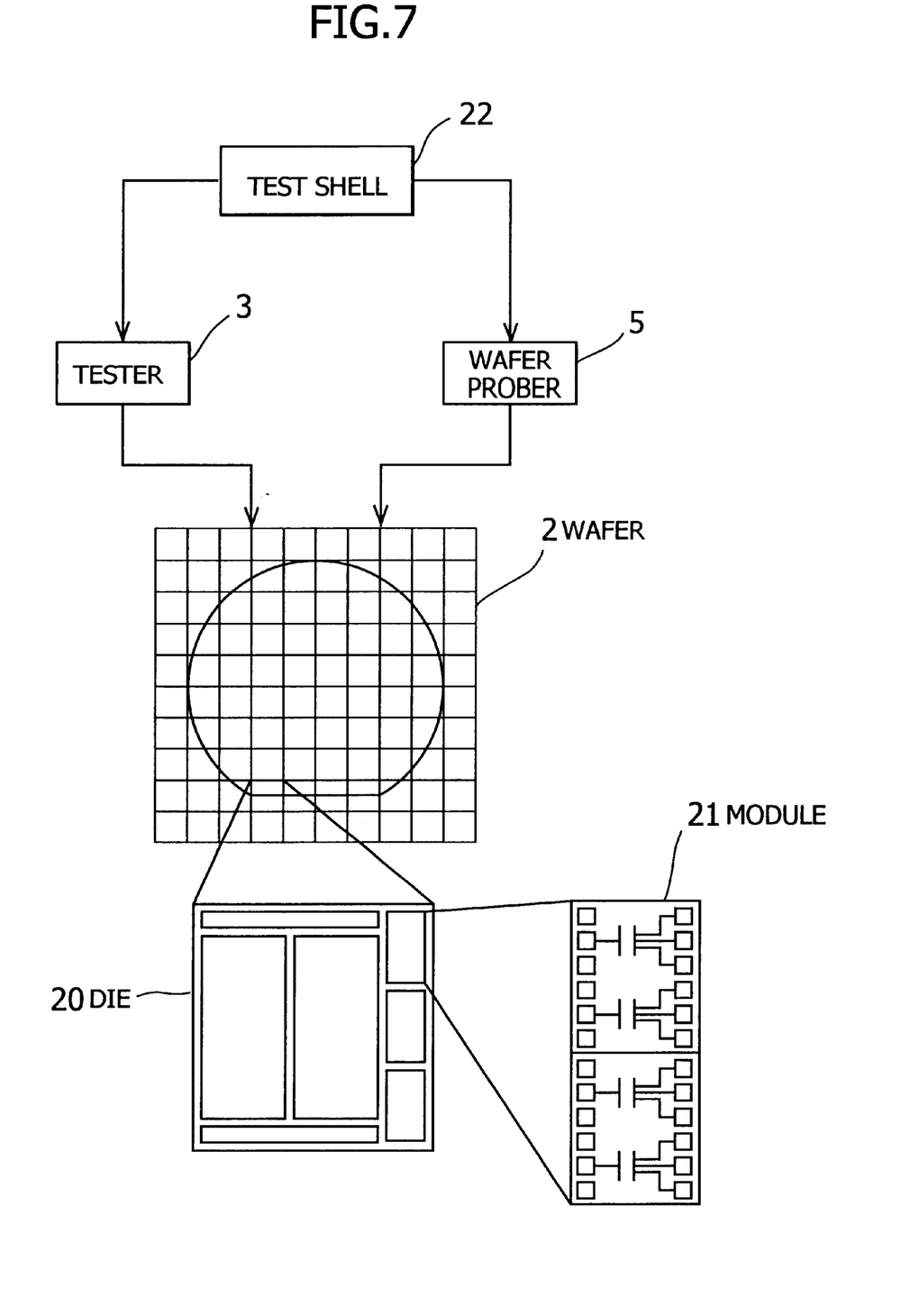
FIG. 7 is a schematic showing relations between a test shell and a wafer, die, and module.
Figure 8:
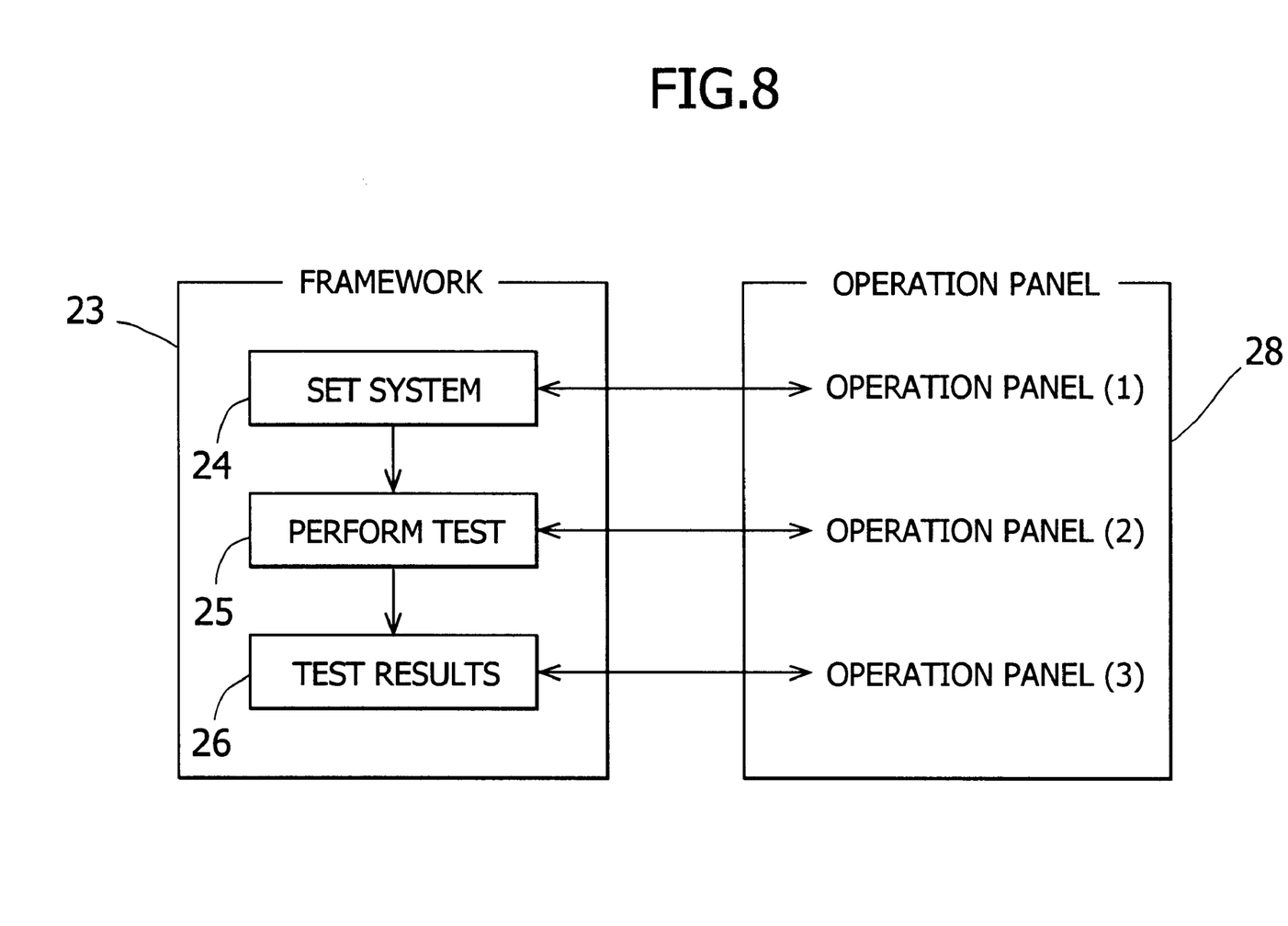
FIG. 8 is a diagram showing relations between an operation panel for a framework and each operation panel.

The definitions of terms used in this specification are as follows. With reference to FIG. 7, the wafer 2 is a group of a plurality of dice 20 on one substrate. The die 20 is a group of modules 21 consisting of a plurality of electronic devices. The module 21, being a group of electronic devices, is the largest unit that can be probed at a time. The wafer prober 5 puts its probe on each module 21, and measurement will be performed by the tester body 3. An electronic device is a unit element, such as a resistor, MOSFET, or other transistor. The wafer lot 4 is the unit for several wafers that can be mounted on the wafer prober 5 at a time. The wafer prober 5 is connected physically and electrically to the wafer 2, and the tester 3, being a program set, performs necessary measurements. The software called test shell 22 coordinates them. The test shell 22 consists of framework 23 and the test plan 7. As shown in FIG. 8, the framework 23 is a program in which processes necessary for testing and a user interface at the time of performing tests are described. As stated above, the contents of a test performed on the wafer 2 are described in the test plan 7.

With reference to FIG. 8, the contents of the framework 23 include the processes of setting an environment for performing a test (24), performing the test (25), and outputting test results (26). At the time of performing a test, an operation panel 28 for operation corresponding to these processes will be displayed as a user interface. The user interface for setting an environment for performing a test (24) enables an operator to set the parameters regarding the wafer prober 5, the operational procedure after judging measurement results, the manner of outputting a report, the contents of measured values displayed at the time of performing a test, the procedure for operating an test environment before performing a test, etc. At the time of performing a test 25, the contents of instructions given through the framework 23 are followed, control is exerted so that the wafer prober 5 puts its probe on the module 21 as described in the test plan 7, and measurements are performed on an object to be measured. When the measurement of one module 21 is completed, the probe moves to another module to be tested next.

Figure 9:
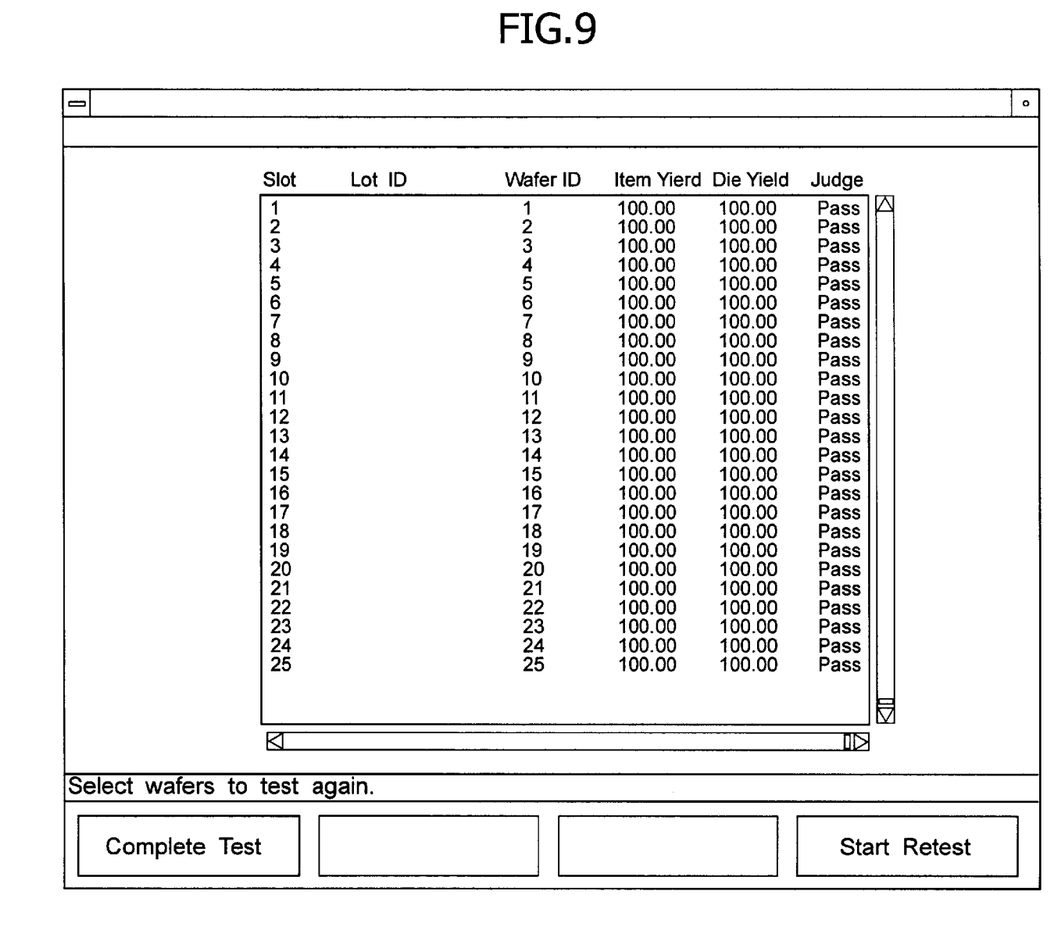
FIG. 9 shows an example of an operation panel.

A user interface for outputting test results 26 enables an operator to specify whether or not another test should be performed on the basis of a judgment on the wafer measured and whether or not measurement results should be reported after performing the second test. An operation panel shown in FIG. 9 is an example of a graphical user interface for performing the above processes dynamically at the time of executing the framework 23. At the time of performing a test, the results of the test described in the test plan 7 and a judgment on each wafer made on the basis of certain criteria will be displayed through this interface.

When this test is being performed, it can be paused by a user's operation with any timing. However, this is done by watching an operation panel which is displayed separately from an operation panel for the framework and indicates the progress of the test and by pressing a pause button at an objective die. This method cannot define pause timing, so a pause position on a program flow (a step in a test algorithm where a test is paused) cannot be specified. In addition, an operator must continue to watch this operation panel during a test, which is very stressful task. Furthermore, the test shell does not provide any means for the operator to know a module on which the wafer prober 5 is putting its probe at that time. Therefore, physical information must be read from the wafer prober 5 in order to know where the wafer prober 5 is positioned. Moreover, if the wafer prober 5 has moved to a module not defined originally, it is difficult to return it to the original pause position, and this makes data collected so far unusable.

A breakpoint may be established in the measuring algorithm 8 or framework 23 to pause a test at a certain position. In this way, however, the program will always stop at a die 20 which has been specified as an object to be measured, then a command will be entered manually. Furthermore, a function to navigate a probe is not included, so, for example, measurement results obtained cannot be compared with those of other dice. The possible extent of failure analysis therefore is limited.

In addition, if a destructive test or the like is performed on the wafer 2, the second measurement on the die which has been measured once is meaningless and a die set aside as a backup will have to be measured. However, such a die is not described in the test plan 7, so no method is provided for moving the probe.

SUMMARY OF THE INVENTION

According to the present invention, there is provided a solution in response to the above-mentioned problems of the related art. An object of the present invention is to provide a semiconductor testing apparatus which makes it possible to specify a position on a wafer at which a test is paused with more accurately and easily.

The present invention provides a semiconductor parametric testing apparatus which makes it possible to specify a die and module on each wafer at which a test should be paused. Furthermore, the present invention provides a semiconductor parametric testing apparatus characterized by pausing a test at a predetermined die and module on each wafer. This allows a test to pause easily at an arbitrary module in an arbitrary die. A defective spot therefore can be found more easily and quickly.

In addition, the present invention provides a semiconductor parametric testing apparatus with which it is possible for an operator to interactively determine the contents of a test after a pause and start a subprogram for performing another test with the specified contents. This makes it possible to perform a particular test, which may be the same as or different from one performed on another die, more easily and quickly on a defective spot found. As a result, the cause of the failure can be discovered more quickly. This subprogram preferably includes a means for setting freely a die or module to be probed. This method will make it easier to, for example, compare output values with the ones for other dice or modules.

The present invention also provides a semiconductor parametric testing apparatus comprising display means for displaying a map for dices and/or modules on a wafer; pointer means for pointing a particular die and/or module on the map; marking means for setting a break point at which a test is to be paused using the pointer means; a memory for storing the position of the break point marked by using the marking means; and means for stopping a test at the breakpoint.

DETAILED DESCRIPTION OF THE PREFERRED EMBODIMENTS

An embodiment of the present invention will now be shown with reference to the accompanying drawings. However, this embodiment will be shown in order to disclose the present invention in detail. It is not intended that the scope of the present invention be limited to this embodiment.

Figure 1:
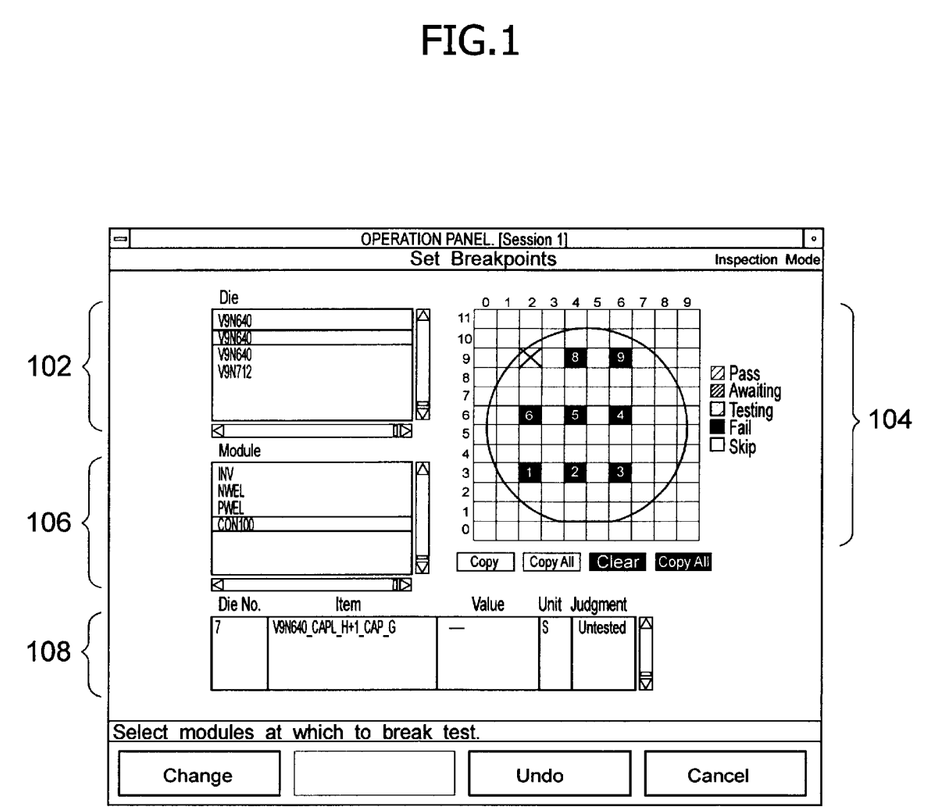
FIG. 1 shows an example of a breakpoint setting screen according to the present invention.

FIG. 1 shows an example of an operation panel for designating a module (breakpoint) at which a test is paused before performing the test on a wafer lot according to one embodiment of the present invention. In a frame 102 (die list), a group of dice each having a certain attribute are displayed (in FIG. 1, four kinds of die attributes are shown). Such die attributes can be defined as die types, and one or more types of dice can be displayed on the die list in the frame 102. When a die type is selected for measurements from the die list in the frame 102 by, for example, clicking a mouse button on it, the die type selected will be highlighted in a frame 104. On a screen showing a die arrangement on a wafer displayed in the frame 104 (wafer map), a die at which a breakpoint is set is selected among those highlighted as proposed ones and is marked (with a cross, in this example) by, for example, clicking on it. Modules on the marked die are displayed in a frame 106 (module list). One or more of them are designated (highlighted) by, for example, clicking on it. Output values obtained by the measurement performed on the marked die are shown in a frame 108.

The designation of a die and module can also be done when a test has been paused temporarily. In this case, a module at which another test should be paused can be designated on the basis of values displayed on an output value list in the frame 108 and judgements of, for example, whether these values are within a limit value. These procedures may be automated.

As stated above, it is impossible with conventional apparatuses to designate in advance a die and module at which a test should be paused. This is one of the characteristics of the present invention.

Figure 2:
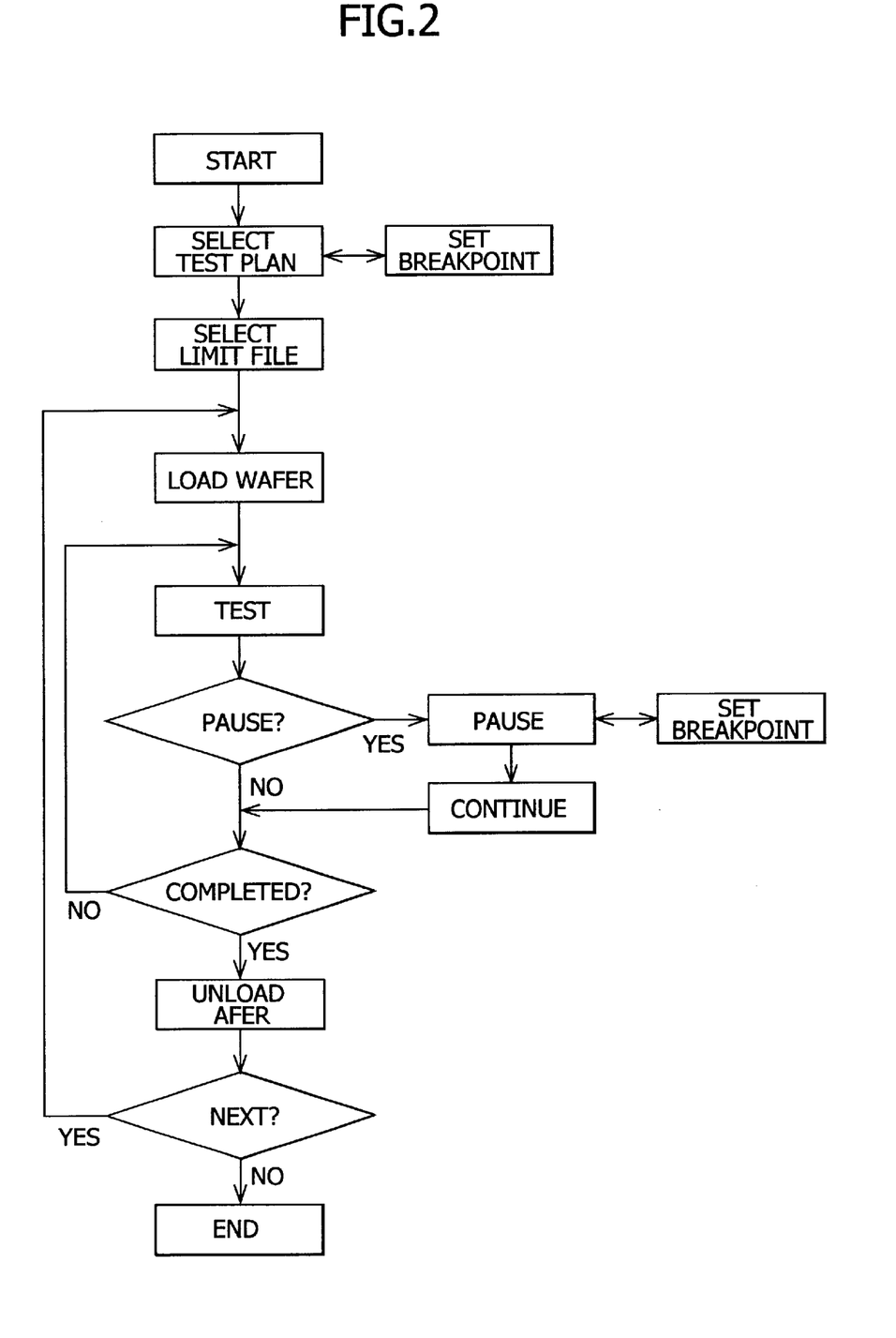
FIG. 2 is a flow chart showing a procedure for setting a breakpoint according to the present invention.

FIG. 2 is a flowchart showing how to set such a breakpoint. Starting a test involves selecting a test plan. At this time one or more breakpoints can also be set. Then a limit file is set. A wafer is loaded, and testing begins. An instruction to pause the test can be given at any time during the test. An additional breakpoint can also be set during the pause in the same way that is used when the test plan is selected. Then the test is continued. When the test is completed, the wafer is retrieved (unloaded). If the test needs to be performed on the next wafer, then it will be repeated from the wafer loading step. In this case, the breakpoint set during the pause may be ignored or added to the breakpoint(s) set in advance.

Figure 3A:
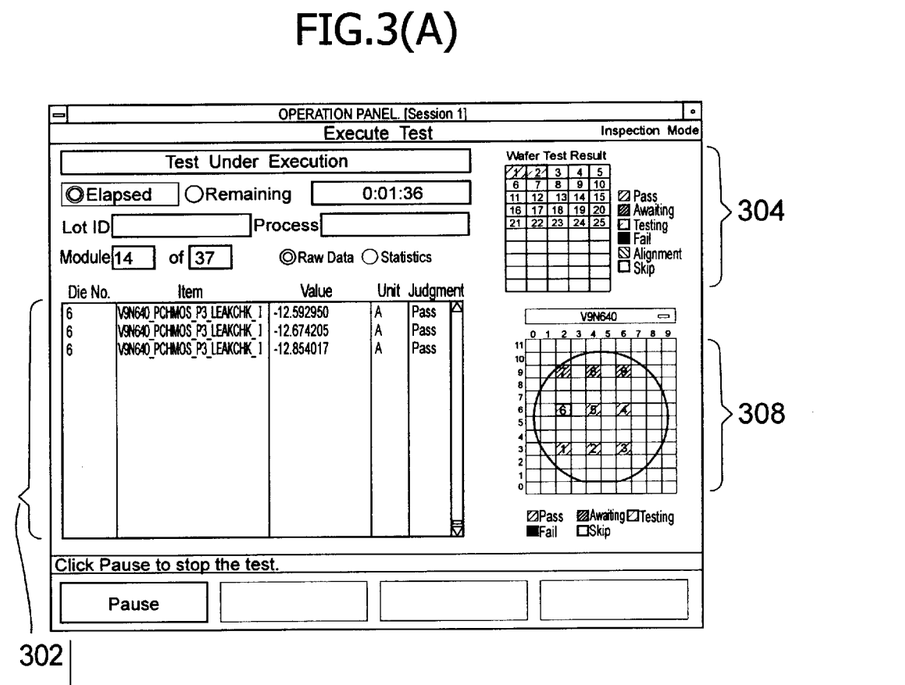
FIG. 3(A) shows an example of an operation panel displayed when a test is being performed.
Figure 3B:
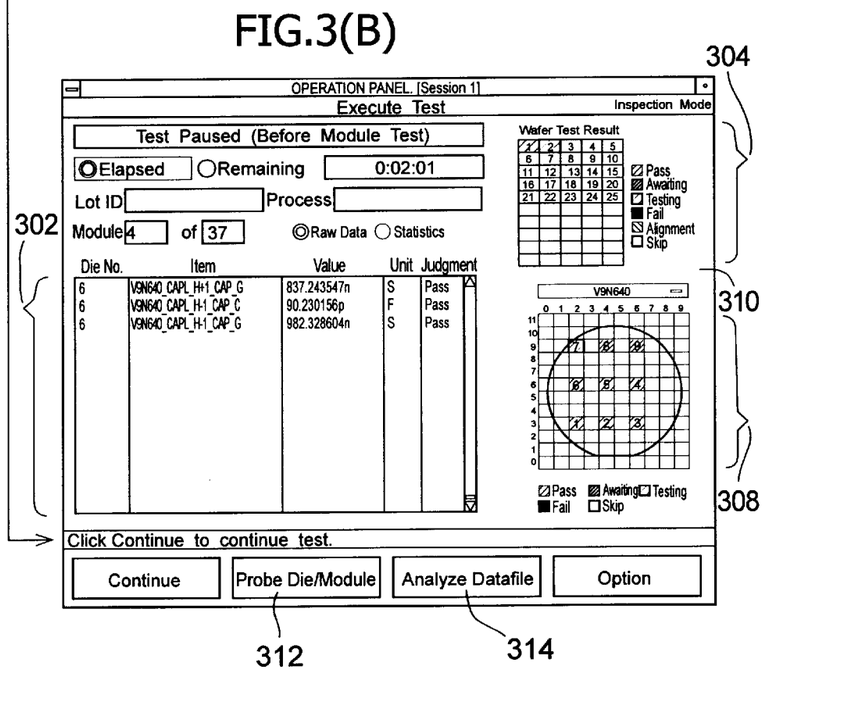
FIG. 3(B) shows an example of an operation panel displayed when a test has been paused.

If a test is performed in compliance with this procedure, it will be paused at a module designated (before testing that module, in this case) regardless of a user's operation on an operation panel. FIG. 3(B) shows a pause screen which will appear at this time. This screen can also be displayed by pressing the "Pause" button displayed on the screen, like the one shown in FIG. 3(A), when a test is being performed. In a measurement result display frame 302, measurement results obtained before reaching this module, that is to say, die numbers, test items, and output values are displayed. In sections 308 and 310 on the screen shown in FIG. 3(B), information regarding the current die position is displayed. In a cassette display frame 304, the number of a cassette in which the current wafer is included is displayed. In a frame 308 (die map), the physical position of the current die on the wafer is shown. A die type is shown in the frame 310. Pressing the "Probe Die/Module" button 312 in FIG. 3(B) will display a screen for designating another die and module to be probed, which will be described with reference to FIG. 4. Pressing the "Analyze Datafile" button 314 will start the program called "Quick Query", and output values obtained before that time can be analyzed.

Figure 4:
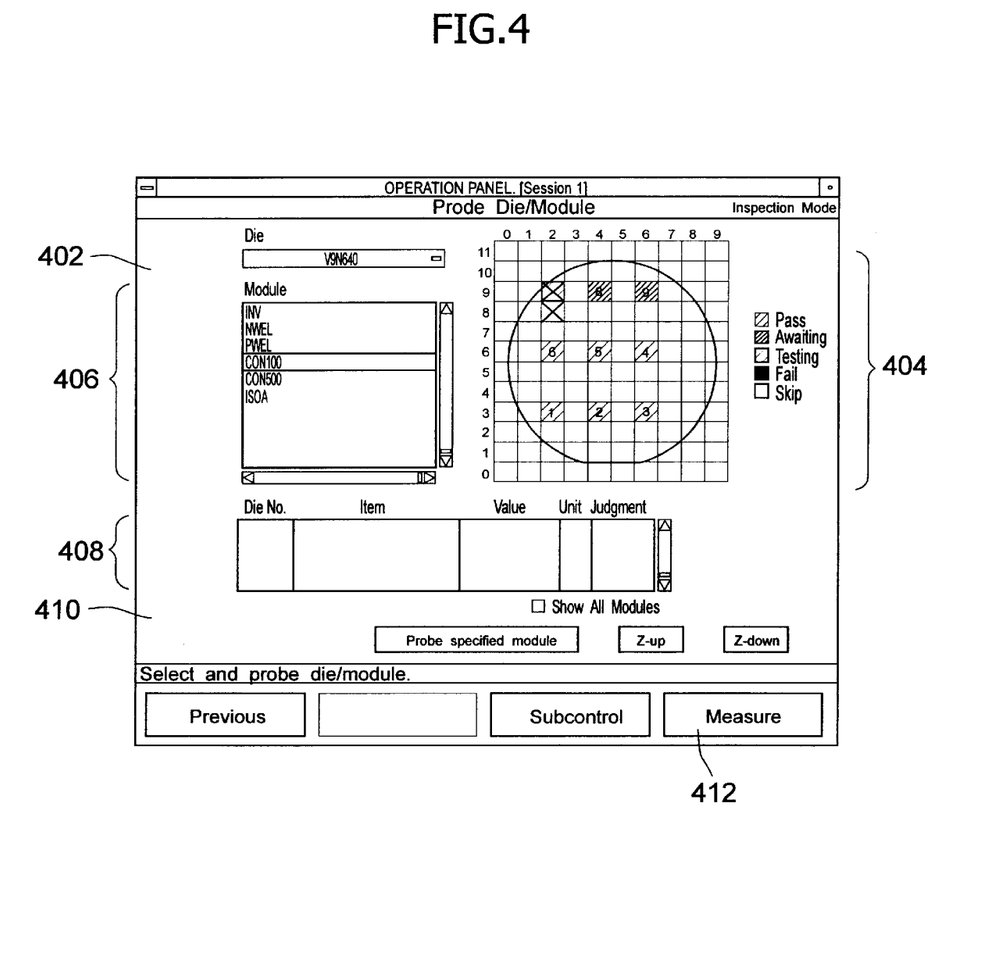
FIG. 4 shows an example of an operation panel for probing a particular module on a particular die.

The screen shown in FIG. 4 is displayed by selecting the "Probe Die/Module" button 312 on the pause screen shown in FIG. 3(B). This screen is used to designate a particular die and module to be probed and also to monitor the probing operation. A die type is displayed in a frame 402. On a screen displayed by selecting the "Probe Die/Module" button 312 on the pause screen, a die on which the probe is being put is shown on the die map in a frame 404 by a cross mark. Dice of an objective type are also displayed on the die may in the frame 404. A die to be probed is designated among the dice displayed. On the screen shown in FIG. 4, a die to be probed is being changed from die 2-9 to die 2-8. A list of measured data regarding this die including output values already obtained is shown in a frame 408. A module to be probed is selected in a frame 406. Clicking on the "Probe Specified Module" button 410 will move the probe to the module specified. Clicking on the "Measure"0 button 412 will start an algorithm panel (not shown), where a measuring algorithm can be selected interactively. Measuring algorithms include various measuring items, such as current-voltage characteristic, gate leakage current, resistance, voltage between gate and source, threshold voltage, and line width, and destructive tests. Various values, such as applied current, maximum applied voltage, waiting time, and sweep speed, can be set. A module is selected this way, and then a measuring algorithm is selected and set as required. By doing so, measurements can be performed on an algorithm panel. It is impossible with conventional apparatuses to start an algorithm panel during a pause. This is one of the characteristics of the present invention.

Figure 5:
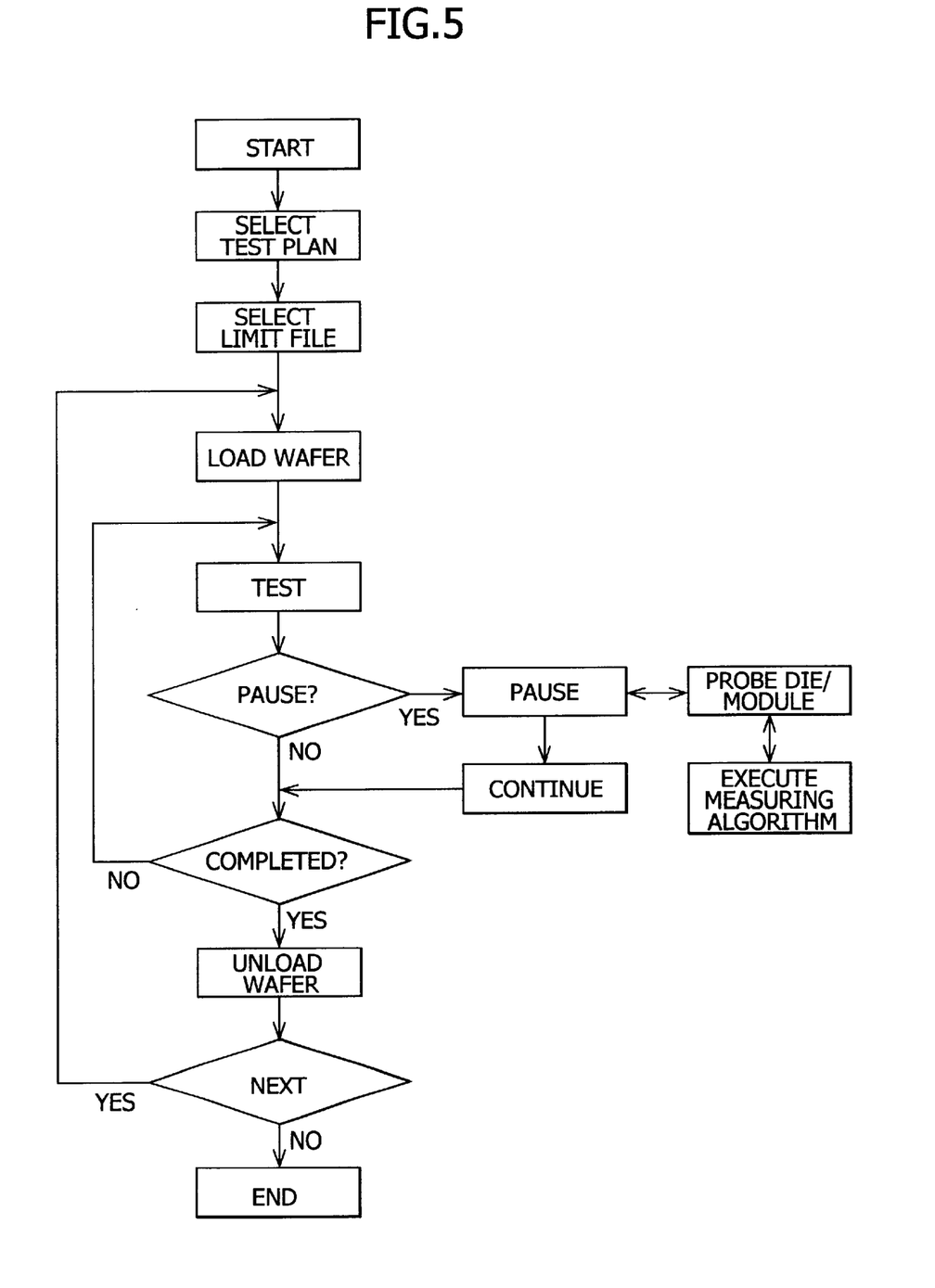
FIG. 5 is a flow chart showing a procedure for measuring a particular module on a particular die by controlling a probe.

FIG. 5 is a flow chart showing this procedure. A test begins by selecting a test plan and limit file and loading a wafer. When an instruction to pause the test is given or when a breakpoint set in advance is reached, the test stops momentarily and the screen shown in FIG. 3(B) appears. By pressing the "Probe Die/Module" button, the screen shown in FIG. 4 is displayed, in which a die, module, measuring algorithm, etc. can be designated. When a measuring algorithm for a particular die and module is designated, the pause screen appears again. The test is resumed from there. When the test is completed, the wafer is retrieved (unloaded). If the test is performed on the next wafer, the above-mentioned steps are repeated from the step of loading another wafer.

Output values and dice can be displayed in different colors according to the results of judgments. This enables an operator to easily select a die containing a defective module or a die prepared as a backup for it.

As described above in detail, the present invention will make it easier to find defective spots on wafers occurring during the manufacture of semiconductor devices and test them in more detail and to investigate the causes of such defects. This significantly improves accuracy and efficiency in parametric tests for semiconductor devices.

The entire disclosure of Japanese Patent Application No. 2000-197845 filed on Jun. 30, 2000 including the specification, claims, drawings and summary are incorporated herein by reference in its entirety.

What is claimed is:

1. A semiconductor parametric testing apparatus comprising:

a tester body for performing a test of a wafer comprising a plurality of dice having a module, said tester body comprising a probe for contacting said module and providing an electric signal to said probe, measuring an electric signal from said module by said probe, and outputting measured data;

a wafer probe for taking said wafer from a wafer lot and for positioning said probe on said module;

a computer, including a display, for processing said measured data and for controlling said tester body and wafer prober;

a measuring program executed by said computer having a test shell comprising:
  a test plan describing an attribute of said test;
  a framework comprising a program of a process for testing and a user interface displayed at least at a time of performing said test, said user interface including an operation panel for designating a predetermined module for which said test is automatically paused, said operation panel comprising;
    a die list of at least one die attribute for selection;
    a wafer map displaying dice for selection, said displayed dice having a die attribute selected from said die list, and
    a module list of a module of one of said dice selected from said wafer map.

2. The semiconductor parametric testing apparatus of claim 1, wherein said operation panel further comprises a frame displaying said measured data, including a measured output value of said module selected from said module list.

3. The semiconductor parametric testing apparatus of claim 1, wherein said die, module, and test location for said automatic pausing of said test is selective.

4. The semiconductor parametric testing apparatus of claim 1, wherein said measured data forms, at least in part, a basis for designating a module for pausing of a test.

5. The semiconductor parametric testing apparatus of claim 4, wherein a value of said measured data is evaluated.

* * * * *